United States Patent
Wieczorek et al.

(10) Patent No.: US 6,423,634 B1
(45) Date of Patent: Jul. 23, 2002

(54) METHOD OF FORMING LOW RESISTANCE METAL SILICIDE REGION ON A GATE ELECTRODE OF A TRANSISTOR

(75) Inventors: Karsten Wieczorek, Reichenberg-Boxdorf; Michael Raab, Radebeul; Rolf Stephan, Dresden, all of (DE)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 09/557,697

(22) Filed: Apr. 25, 2000

(51) Int. Cl.⁷ .............................. H01L 21/44
(52) U.S. Cl. ................ 438/655; 438/592; 438/649; 438/656; 438/683
(58) Field of Search ............... 438/305, 607, 438/683, 199, 300, 303, 231, 562, 582, 649, 655, 656, 682, 297, 230, 642, 684, 592; 257/383, 384, 388, 412, 757, 769, 770

(56) References Cited

U.S. PATENT DOCUMENTS

| | | | |
|---|---|---|---|
| 4,897,368 A | 1/1990 | Kobushi et al. | 437/200 |
| 5,034,348 A | 7/1991 | Hartswick et al. | 437/200 |
| 5,352,631 A | 10/1994 | Sitaram et al. | 437/200 |
| 5,447,875 A | 9/1995 | Moslehi | 437/41 |
| 5,937,300 A | 8/1999 | Sekine et al. | 438/300 |
| 6,074,922 A | 6/2000 | Wang et al. | 438/303 |
| 6,184,117 B1 | 2/2001 | Lu | 438/592 |
| 6,238,986 B1 * | 5/2001 | Kepler et al. | 438/301 |
| 6,238,989 B1 * | 5/2001 | Wc Huang et al. | 438/305 |
| 6,268,257 B1 * | 7/2001 | Wieczorek et al. | 438/305 |
| 6,268,286 B1 * | 7/2001 | Gauthier et al. | 438/655 |
| 6,268,295 B1 | 7/2001 | Ohta et al. | 438/735 |
| 6,271,133 B1 * | 8/2001 | Lim et al. | 438/683 |
| 6,274,445 B1 * | 8/2001 | Nouri | 438/300 |
| 6,277,735 B1 * | 8/2001 | Matsubara | 438/649 |
| 6,281,102 B1 * | 8/2001 | Cao et al. | 438/592 |

OTHER PUBLICATIONS

Wolf and Tauber; Silicon Processing for the VLSI Era vol. 1: Process Technology; 1986 Lattice Press; p. 198.*
Goto et al., "Optimization of Salicide Processes for sub 0.1–μm CMOS Devices," *1994 Symposium on VLSI Technology Digest of Technical Papers*, pp. 119–120, Apr. 1994.
Sohn et al., "High Thermal Stability and Low Junction Leakage Current of Ti Capped Co Salicide and its Feasibility for High Thermal Budget CMOS Devices," Mar. 1998.
Goto et al., "A New Leakage Mechanism of Co Salicide and Optimized Process Conditions," *IEEE Transactions on Electron Devices*, vol. 46, No. 1, p. 117, Jan. 1999.

* cited by examiner

Primary Examiner—Wael Fahmy
Assistant Examiner—Fernando Toledo
(74) Attorney, Agent, or Firm—Williams, Morgan & Amerson, P.C.

(57) ABSTRACT

In one embodiment, a protective layer is formed on the top surface of the gate electrode of a transistor device prior to the formation of low resistance metal silicide regions on the drain and source regions. The protective layer prevents the simultaneous formation of a metal silicide region on the gate electrode. Thereafter, a process layer is formed above the source/drain regions and the cover layer that is positioned above the gate electrode. Next, a surface of the process layer is planarized to expose the cover layer, and the cover layer is removed. Then, a metal silicide region is formed above the gate electrode by depositing a layer of refractory metal and performing at least one anneal process.

38 Claims, 3 Drawing Sheets

METHOD OF FORMING LOW RESISTANCE METAL SILICIDE REGION ON A GATE ELECTRODE OF A TRANSISTOR

BACKGROUND OF THE INVENTION

1. Field of the Invention

The present invention relates to integrated circuit devices and the fabrication of such devices and, more particularly, to semiconductor devices having a gate electrode with improved electrical characteristics and a method of making same.

2. Description of the Related Art

In the field of semiconductor integrated circuit devices, design features, e.g., gate length, channel length, are being steadily decreased in order to achieve higher package densities and to improve device performance. The rapid advance of field effect transistor design has affected a large variety of activities in the field of electronics in which the transistors are operated in a binary switching mode. In particular, complex digital circuits, such as micro-processors and the like, demand fast-switching transistors. Accordingly, the distance between the drain region and the source region of a field effect transistor, commonly referred to as the channel length or gate length dimension, has been reduced to accelerate the formation of a conductive channel between a source and a drain electrode as soon as a switching gate voltage is applied and, moreover, to reduce the electrical resistance of the channel.

Thus, a transistor structure has been created where the longitudinal dimension of the transistor, commonly referred to as the width dimension, extends up to 20 $\mu$m, whereas the distance of the drain and source, i.e., the gate length, may be reduced down to 0.2 $\mu$m or less. As the gate length of the channel has been reduced to obtain the desired switching characteristic of the drain-source line, the length of the gate electrode is also reduced. Since the gate electrode is typically contacted at one end of its structure, the electrical charges have to be transported along the entire width of the gate electrode, i.e., up to 20 $\mu$m, to uniformly build up the transverse electric field that is necessary for forming the channel between the drain and source regions. Due to the small length of the gate electrode, which usually consists of polycrystalline silicon, the electrical resistance of the gate electrode is relatively high, and it may cause high RC-delay time constants. Hence, the transverse electrical field necessary for fully opening the channel is delayed, thereby further deteriorating the switching time of the transistor line. As a consequence, the rise and fall times of the electrical signals are increased and the operating frequency, i.e., the clock frequency, has to be selected so as to take into account the aforementioned signal performance.

In view of the foregoing, the switching times of field effect transistors are no longer only limited by the drain and source characteristics, i.e., dimension and resistance, but also significantly depend on the signal propagation along the gate electrode. However, the resistance of the gate electrode affects the propagation time of a signal along the gate width direction. To minimize the electrical resistance of the drain and source regions, as well as that of the gate electrode, a silicidation process is usually performed in which a portion of the aforementioned regions are transformed into a metal silicide region in order to lower the respective electrical resistances. The depth of the metal silicide regions on the surfaces of the drain region, source region and gate electrode is limited by the requirements for the integrity of shallow drain/source junctions. That is, the metal silicide regions can only be made a certain thickness without adversely impacting the source/drain regions.

With reference to FIGS. 1A–1C, an illustrative example of forming a MOS transistor according to a typical prior art process will be described. It is to be noted that the drawings in this application are merely schematic depictions of the various stages in manufacturing the illustrative device under consideration. The skilled person will readily appreciate that the dimensions shown in the drawings are not true to scale, and that different portions or layers are not separated by sharp boundaries as portrayed in the drawings but may instead comprise continuous transitions. Furthermore, various process steps, as described below, may be performed differently depending on particular design requirements. Moreover, in this description, only the relevant steps and portions of the device necessary for the understanding of the present invention are considered.

FIG. 1A shows a schematic cross-section through an illustrative MOS transistor at a specific stage of a typical prior art manufacturing process. Within a silicon substrate 1, a plurality of shallow trench isolations 2 comprised of, for example, silicon dioxide, are formed. The trench isolations 2 define a transistor active region 3 in which a channel region, a drain region and a source region will be formed. Over the transistor active region 3, a gate electrode 4 is formed. The gate electrode 4 may be comprised of a variety of materials, such as polycrystalline silicon. A thin gate insulation layer 5 separates the gate electrode 4 and the transistor active region 3. The process steps involved in patterning the gate electrode 4 are of common knowledge to the skilled person, and usually include the deposition of anti-reflecting coating (ARC) and the employment of short exposure wavelengths, such as wave-lengths in the DUV (deep ultraviolet) range, while performing the required photolithography steps. Since these procedures are commonly known, the description thereof will be omitted. Moreover, sidewall spacers 8, usually consisting of, for example, silicon dioxide or silicon nitride, may be formed adjacent the sidewalls of the gate electrode 4 for aiding the forming of drain and source regions 9.

Next, as shown in FIG. 1B, a metal layer 6 is deposited over the transistor shown in FIG. 1A. The metal layer 6 may consist of a refractory metal, such as titanium, cobalt, etc., and it is provided in order to feed a subsequent silicidation process which is initialized by a heat treatment such as rapid thermal annealing (RTA). After the heat treatment, the portion of the metal layer 6 which has not reacted with the exposed surfaces of the transistor active region 3 and the gate electrode 4 is removed.

FIG. 1C schematically shows the cross-section of the MOS transistor shown in FIGS. 1A and 1B after a further heat treatment, such as an RTA process, has been performed. Through this further heat treatment, the silicided portions of the drain and source regions 9, as well as of the gate electrode 4, are converted into a low-resistance phase, e.g., a metal silicide. Accordingly, metal silicide portions 7 are formed on the source and drain regions 9 and a metal silicide portion 10 is formed on the upper surface of the gate electrode 4. The depth of the metal silicide portion on the gate electrode 4 is limited by the depth of the drain and source regions 9. That is, using traditional silicidation processing, the thickness of the metal silicide portion 10 cannot be made too thick; otherwise, too much of the source/drain regions 9 will be consumed during the silicidation process. Accordingly, the major part of the gate electrode 4 is maintained as polycrystalline silicon having a relatively low conductivity. As previously discussed, such an arrangement will cause a delay in charge carrier transportation along the gate width, whereby the signal performance of the device deteriorates.

In view of the above-mentioned problems, a need exists for a transistor having an increased signal performance and for a method of fabricating such a device. The present invention is directed to a method of making a semiconductor device that solves, or at least reduces, some or all of the aforementioned problems.

SUMMARY OF THE INVENTION

The present invention is directed to a method of forming a low resistance metal silicide region in a gate electrode of a transistor. In one illustrative embodiment, the method comprises forming a gate stack comprised of a gate insulation layer, a gate electrode positioned above the gate insulation layer, and a cover layer positioned above the gate electrode. The method further comprises forming source/drain regions in the substrate proximate the gate electrode, forming a first layer of refractory metal above the source/drain regions and the cover layer, and converting a portion of the first layer of refractory metal to metal silicide contacts above the source/drain regions. The method continues with the formation of a process layer above the metal silicide contacts and the cover layer, planarizing a surface of the process layer to expose the cover layer, and removing the cover layer. The method concludes with the formation of a second layer of refractory metal above the gate electrode and conversion of a portion of the second layer of refractory metal to a metal silicide region above the gate electrode.

BRIEF DESCRIPTION OF THE DRAWINGS

The invention may be understood by reference to the following description taken in conjunction with the accompanying drawings, in which like reference numerals identify like elements, and in which.

Figure 1A:
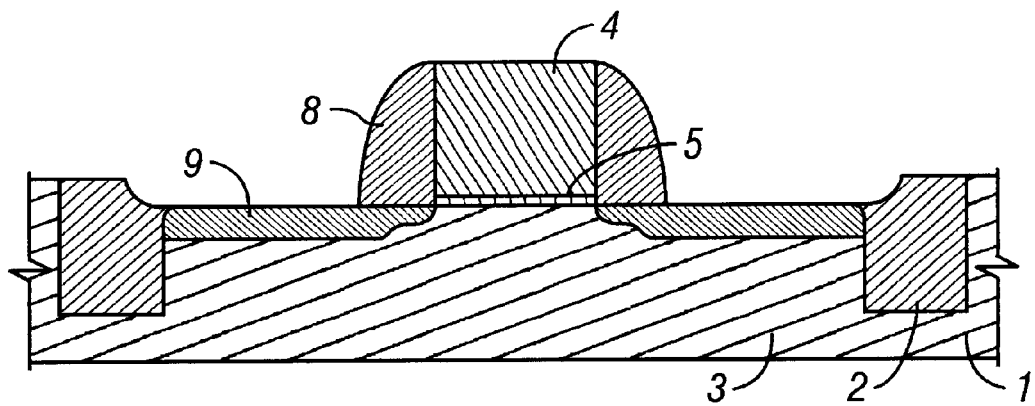
FIGS. 1A–1C are schematic cross-sectional views of various stages during the formation of the field effect transistor according to a typical prior art process.
Figure 1B:
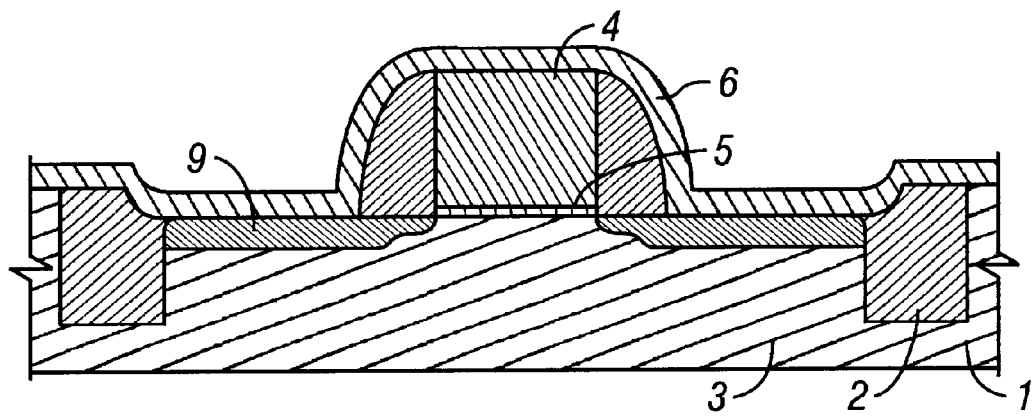
Figure 1C:
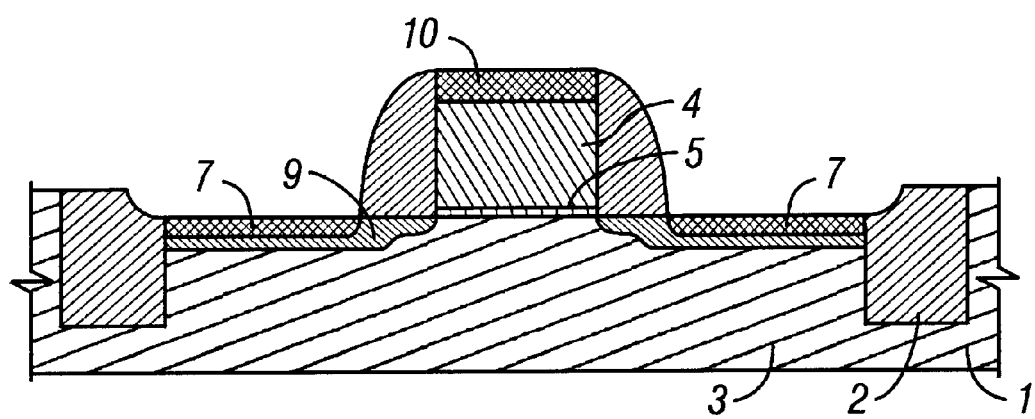

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to FIGS. 2A–2F. Although the various regions and structures of a semiconductor device are depicted in the drawings as having very precise, sharp configurations and profiles, those skilled in the art recognize that, in reality, these regions and structures are not as precise as indicated in the drawings. Additionally, the relative sizes of the various features depicted in the drawings may be exaggerated or reduced as compared to the size of those feature sizes on fabricated devices. Nevertheless, the attached drawings are included to describe and explain illustrative examples of the present invention.

In general, the present invention is directed to a method of forming low resistance metal silicide regions on a gate electrode of a transistor. As will be readily apparent to those skilled in the art upon a complete reading of the present application, the present method is applicable to a variety of technologies, e.g., NMOS, PMOS, CMOS, etc., and is readily applicable to a variety of devices, including, but not limited to, logic devices, memory devices, etc. Although the present invention is demonstrated with reference to a MOS transistor formed in a silicon substrate, the present invention may be applied to any kind of semiconductor in which a narrow gate structure is required. For example, the semiconductor substrate can be any appropriate material such as silicon, silicon-germanium, etc.

Figure 2A:
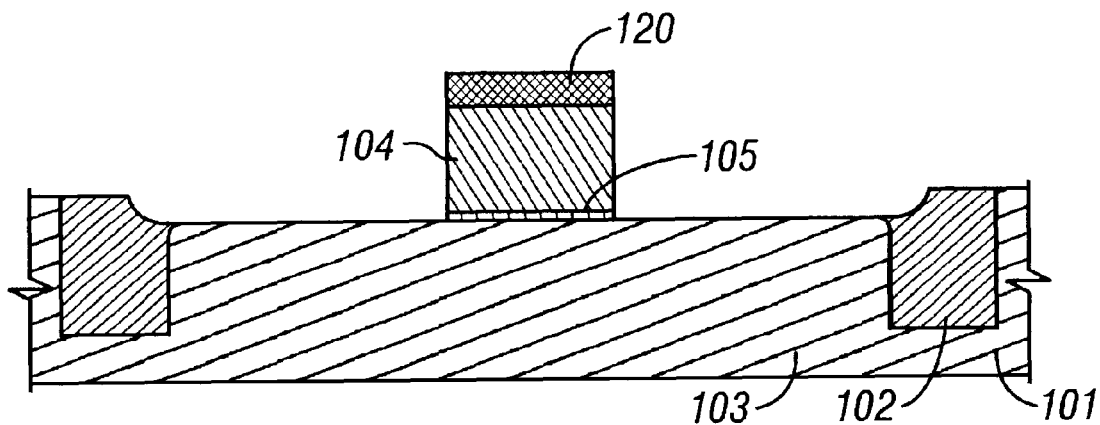
FIGS. 2A–2F are schematic cross-sectional views of various stages during the formation of a field effect transistor according to one illustrative embodiment of the present invention.

FIGS. 2A–2F show schematic cross-sectional views of various procedural steps in the formation of a transistor in conformity with one illustrative embodiment of the present invention. In FIG. 2A, shallow trench isolations 102 comprised of, for example, silicon dioxide, are formed within a silicon substrate 101. The trench isolations 102 define a transistor active region 103 in the substrate 101. A gate insulation layer 105 and a gate electrode 104, having sidewalls 130, are formed over the active region 103 by forming layers of the appropriate material and patterning the layers using traditional photolithography and one or more etching processes. The gate insulating layer 105 isolates the gate electrode 104 from the transistor active region 103.

As is common practice in the formation of cutting edge transistor gates, an anti-reflecting coating may be employed in the photolithography process. According to this embodiment, an anti-reflecting coating, such as silicon nitride, silicon rich nitride, etc., is formed above the layer comprising the gate electrode material prior to patterning operations. After the patterning is done, the portion of the anti-reflective coating acts as a cover layer 120 above the gate electrode 104.

The gate electrode 104 may be formed from a variety of materials, and by a variety of techniques. For example, the gate electrode 104 may be comprised of polycrystalline silicon, and it may have a thickness ranging from approximately 1000–3000 Å. The gate electrode 104 may be formed by patterning a layer of material that is formed by a deposition process, such as an LPCVD or PECVD process. The gate insulation layer 105 may also be formed from a variety of materials, e.g., an oxide, an oxynitride, silicon dioxide, silicon oxynitride, or any other material sufficient to allow the gate insulation layer 105 to serve its intended purpose. The gate insulation layer 105 may be formed by a variety of techniques, such as thermal oxidation, deposition, etc.

Figure 2B:
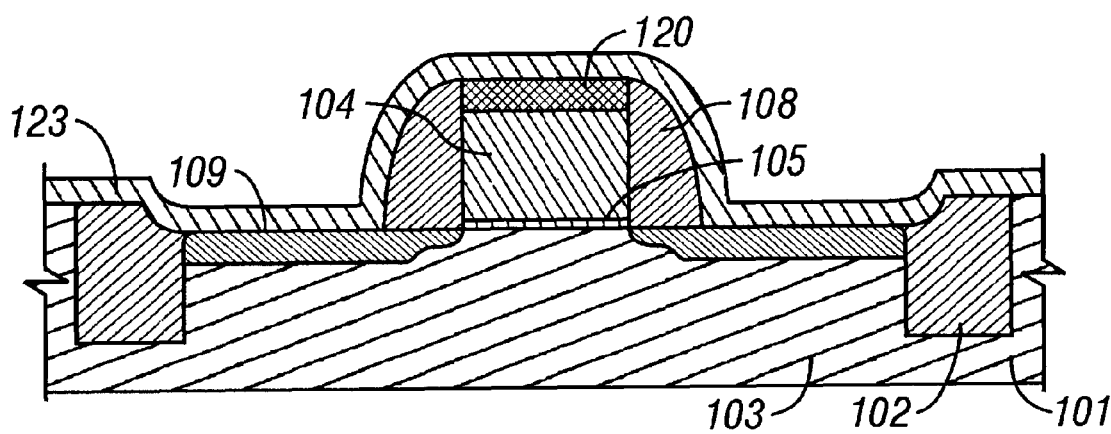

In FIG. 2B, the transistor is shown after drain and source regions 109 and sidewall spacers 108 have been formed. The sidewall spacers 108 may be comprised of a variety of materials, such as silicon dioxide, silicon nitride, etc. After the ion implantation defining the drain and source regions 109, a metal layer 123 comprised of a refractory metal is formed over the cover layer 120, the sidewall spacers 108 and the source and drain regions 109. The metal layer 123 will be used in subsequent silicidation processing. The metal layer 123 may be comprised of a variety of materials, such as cobalt, titanium, tantalum, zirconium, tungsten, nickel, platinum, molybdenum, etc., and it may be formed by a variety of processes, e.g., LPCVD, PECVD, etc. The thickness of the metal layer 123 may vary. In one illustrative embodiment, the metal layer 123 is comprised of cobalt, having a thickness ranging from approximately 100–700 Å.

Figure 2C:
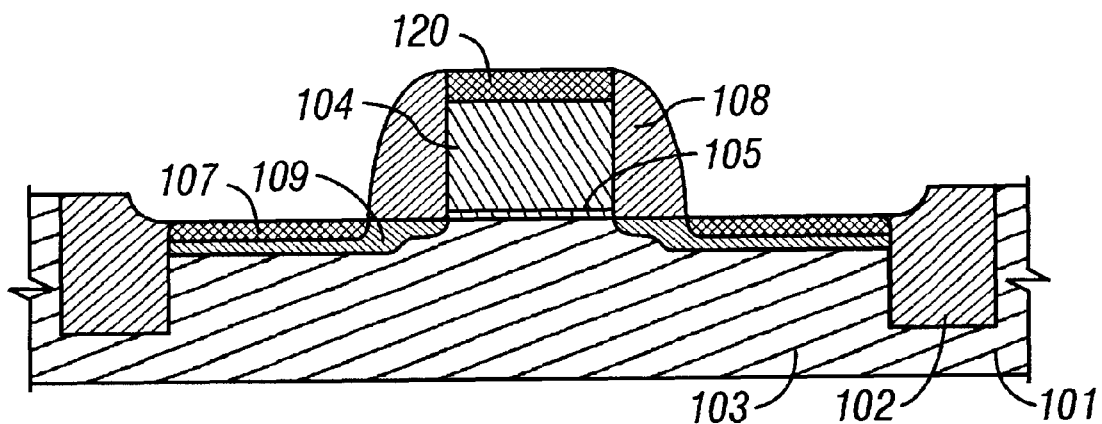

In FIG. 2C, metal silicide contacts 107 have been formed on the transistor above the source/drain regions 109. The metal silicide contacts 107 are formed by performing at least one anneal process. For example, the metal silicide contacts 107 may be formed by performing a low-temperature rapid thermal annealing process to cause a chemical reaction of the silicon and the metal layer 123. Next, unreacted portions of the metal layer 123 are removed, ie., the portion of the metal layer 123 that has not reacted with the silicon in the drain and source regions 109, or which has covered the areas protected by the sidewall spacers 108 and the cover layer 120, is removed by a selective etching process. Finally, a high-temperature rapid thermal annealing process is performed to convert the metal silicide in the drain and source regions 109 into a low-resistance phase in order to form metal silicide contacts 107. The depth of the metal silicide contacts 107 is substantially controlled by the thickness of the metal layer 123 formed before the silicidation process begins. Silicidation of the gate electrode 104 is prevented by the cover layer 120. That is, the cover layer 120 prevents the metal layer 123 from contacting the gate electrode 104.

Figure 2D:
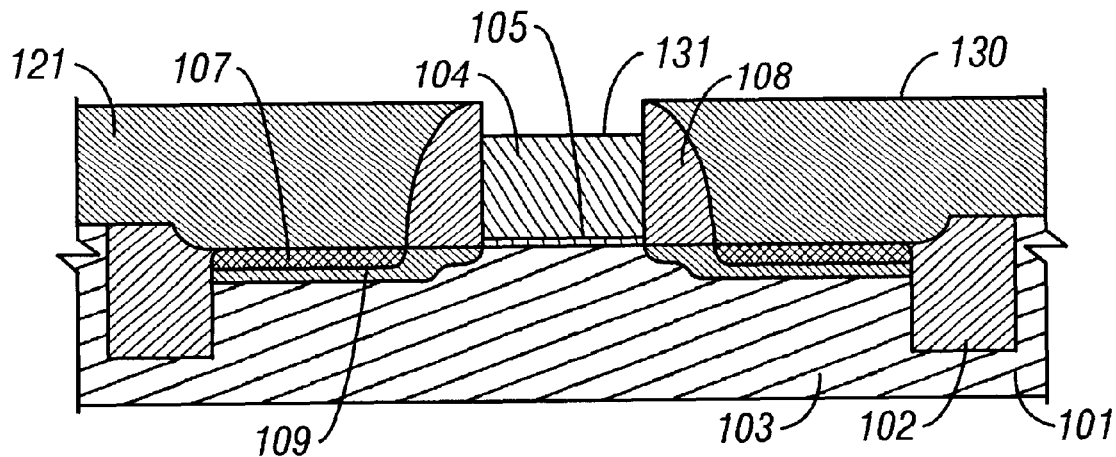

As shown in FIG. 2D, a process layer 121 is formed above the structure depicted in FIG. 2C. The process layer 121 may be comprised of a variety of materials, such as silicon dioxide, or any other material that may be selectively etched with respect to the material comprising the cover layer 120. The process layer 121 may be formed by a variety of techniques, e.g., LPCVD, PECVD, etc., and it may have a thickness ranging from approximately 1000–10,000 Å. In one illustrative embodiment, the process layer 121 is comprised of silicon dioxide having a thickness ranging from approximately 1000–4000 Å that is deposited by a chemical vapor deposition of tetraethylorthosilicate (TEOS). Subsequently, the surface 130 of the process layer 121 is planarized so as to expose the cover layer 120 (not shown in FIG. 2D). Next, the cover layer 120 is removed by, for instance, a wet-chemical treatment using hot $H_3PO_4$. Then, the exposed top surface 131 of the gate electrode 104 is cleaned to allow for the subsequent formation of a metal silicide region above the gate electrode, which will be described more fully below.

Figure 2E:
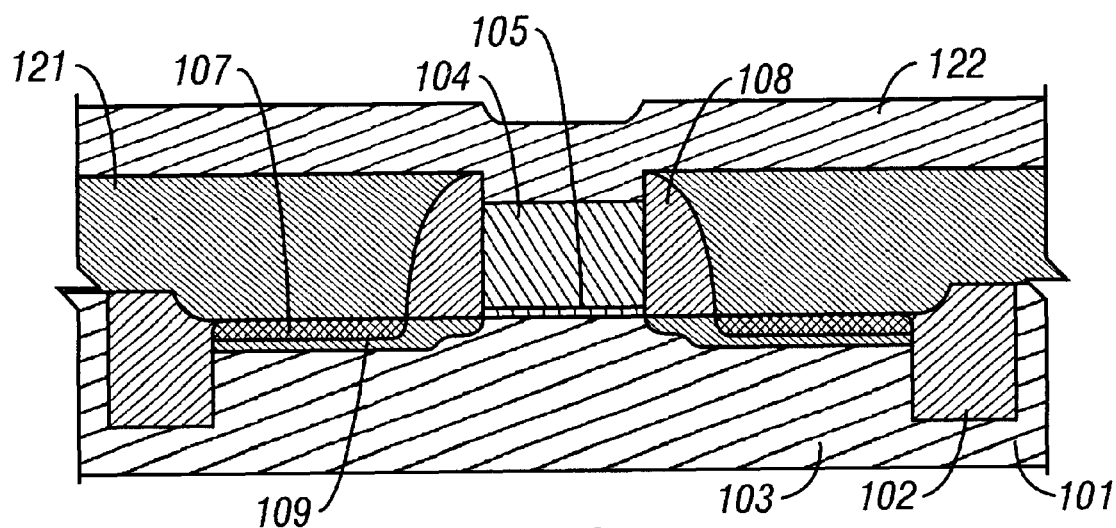

As shown in FIG. 2E, a metal layer 122 has been formed over the structure shown in FIG. 2D. The metal in the metal layer 122 may or may not be of the same type as used for the metal layer 123. The metal layer 123 in FIG. 2B and the metal layer 122 may be comprised of a variety of metals, such as cobalt, zirconium, tungsten, titanium, nickel, tantalum, platinum, molybdenum, etc. Moreover, the metal layers 123 and 122 may be comprised of the same or different metals. The thickness of the metal layer 122 is targeted to result in a final depth of the metal silicide portion 110 (see FIG. 2F) that will provide low gate resistance, but still maintain a minimum thickness of the polycrystalline gate electrode 104A over the gate insulation layer 105. The minimum thickness of the polycrystalline gate electrode 104A after silicidation will vary depending upon the device under construction and its operational parameters. However, in general, using present day technology, the residual thickness gate electrode 104A should have a minimum thickness that ranges from approximately 50–500 Å. This will ensure that the desired and well-known characteristics of the silicon-$SiO_2$ interface are maintained, and prevent electrical breakdown of the transistor due to metal atoms diffusing into the gate insulating layer 105.

Figure 2F:
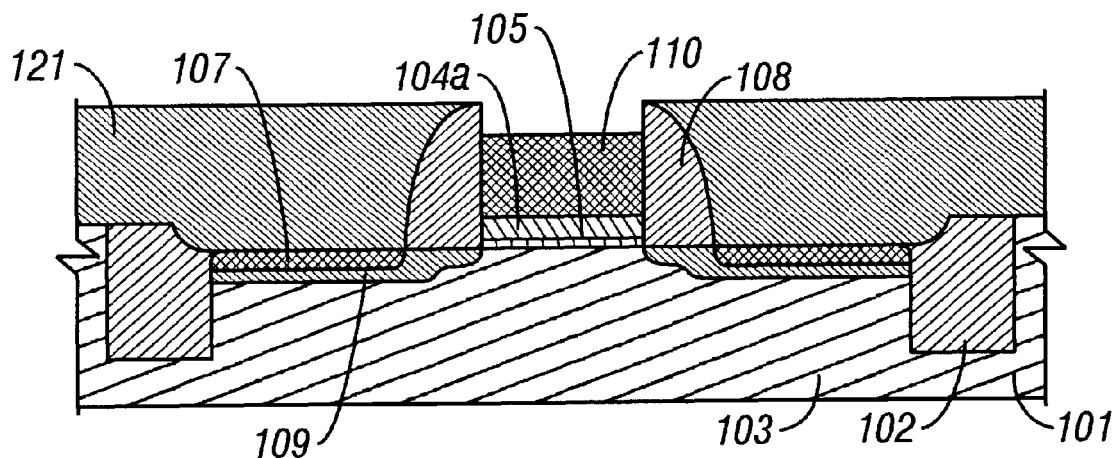

In the illustrative example where the metal layers 122 and/or 123 are comprised of cobalt, a thickness of approximately one unit length consumes approximately 3.8 units of the thickness of the silicon, e.g., the polycrystalline gate electrode 104 and silicon substrate 101, respectively, during the silicidation process. In one illustrative embodiment, the metal layer 122 has a thickness which is approximately 25 percent of that of the polycrystalline gate electrode 104. In this situation, the resulting metal silicide portion 110 has a sufficient depth to reduce the resistance of the gate electrode, yet still preserve a relatively thin polycrystalline layer 104A over the gate insulation layer 105. If a silicide portion 110 of a lesser depth is desired, a thinner metal layer 122 may be used. For metals other than cobalt, the corresponding silicon/metal ratios vary depending on the valence and the atomic radius of the metal, and in choosing the appropriate thickness of the metal layer, these factors have to be considered. Moreover, a thin cap layer consisting of, e.g., titanium nitride (TiN), may be deposited over the respective metal layer prior to the silicidation process so as to prevent the gas in the reaction chamber from reacting with the metal. FIG. 2F shows the device after completion of the silicide process sequence consisting of an initial rapid thermal annealing process with a low temperature, a selective metal removal and final rapid thermal annealing process with a high temperature so as to form the metal silicide portion 110 of the gate electrode 104.

As a result, the transistor fabricated according to the present invention features a low-resistance metal silicide portion 110 on top of the gate electrode which exhibits an increased depth compared to a prior art device to achieve a low gate resistance. Low-resistance metal silicide contacts 107 on the drain and source regions may be made in such a manner so as to exhibit a small depth in order to meet the requirements of shallow junction integration. Thus, further device scaling is supported while, at the same time, the signal performance of the device is improved.

The present invention provides a transistor in an integrated circuit and a method of manufacturing the same, wherein an increased portion of the gate electrode is converted into a low-resistance metal silicide region, thereby significantly lowering the overall electrical resistance of the gate electrode. In one illustrative embodiment, the method comprises providing a semiconductor substrate having a surface, defining a transistor active region in the substrate, the transistor active region having a depth dimension perpendicular to the surface of the substrate, forming a gate insulating layer on the transistor active region, depositing a gate electrode material on the gate insulating layer, patterning a gate electrode having a protection layer on a top surface, forming a drain region and a source region by means of side wall spacer formation and ion implantation, forming respective low-resistance metal silicide contacts on the drain region and source region, wherein the gate electrode is protected by the side wall spacers and the protection layer, removing the protection layer, depositing over the gate electrode a first metal layer having a first predefined thickness, and initializing penetration of material of the first metal layer into the gate electrode to lower an electrical resistance of a portion of the gate electrode, wherein a depth of said portion of the gate electrode is controlled by the first predefined thickness.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    forming a gate insulation layer above a surface of a semiconducting substrate;
    forming a gate electrode above said gate insulation layer;
    forming a cover layer above said gate electrode;
    forming source/drain regions in said substrate proximate said gate electrode;
    forming a first metal layer comprised of a refractory metal above said cover layer and said source/drain regions;
    converting at least a portion of said first metal layer to metal silicide contacts above said source/drain regions;
    forming a process layer above said metal silicide contacts and said cover layer above said gate electrode;
    planarizing a surface of said process layer to expose said cover layer;
    removing said cover layer from above said gate electrode;
    forming a second metal layer comprised of a refractory metal above said gate electrode and said process layer; and
    converting at least a portion of said second metal layer to a metal silicide region above said gate electrode.

2. The method of claim 1, wherein forming a gate insulation layer above a surface of a semiconducting substrate comprises forming a gate insulation layer by at least one of a deposition process and a thermal growth process above a surface of a semiconducting substrate.

3. The method of claim 1, wherein forming a gate insulation layer above a surface of a semiconducting substrate comprises forming a gate insulation layer comprised of at least one of silicon dioxide, silicon nitride, and silicon oxynitride above a surface of a semiconducting substrate.

4. The method of claim 1, wherein forming a gate electrode above said gate insulation layer comprises forming a gate electrode comprised of polysilicon above said gate insulation layer.

5. The method of claim 1, wherein forming a gate electrode above said gate insulation layer comprises:
    depositing a layer of gate electrode material; and
    patterning said layer of gate electrode material to define a gate electrode.

6. The method of claim 1, wherein forming a cover layer above said gate electrode comprises forming a cover layer comprised of at least one of silicon nitride and silicon oxynitride above said gate electrode.

7. The method of claim 1, wherein forming a cover layer above said gate electrode comprises depositing a cover layer above said gate electrode.

8. The method of claim 1, wherein forming source/drain regions in said substrate proximate said gate electrode comprises performing at least one ion implantation process to form source/drain regions in said substrate proximate said gate electrode.

9. The method of claim 1, wherein forming a first metal layer comprised of a refractory metal above said cover layer and said source/drain regions comprises depositing a first metal layer comprised of a refractory metal above said cover layer and said source/drain regions.

10. The method of claim 1, wherein forming a first metal layer comprised of a refractory metal above said cover layer and said source/drain regions comprises forming a first metal layer comprised of at least one of cobalt, titanium, tungsten, nickel, zirconium, tantalum, platinum and molybdenum above said cover layer and said source/drain regions.

11. The method of claim 1, wherein converting at least a portion of said first metal layer to metal silicide contacts above said source/drain regions comprises performing at least one anneal process to convert at least a portion of said first metal layer to metal silicide contacts above said source/drain regions.

12. The method of claim 1, wherein forming a process layer above said metal silicide contacts and said cover layer above said gate electrode comprises depositing a process layer above said metal silicide contacts and said cover layer above said gate electrode.

13. The method of claim 1, wherein forming a process layer above said metal silicide contacts and said cover layer above said gate electrode comprises forming a process layer comprised of at least one of silicon dioxide, silicon nitride and silicon oxynitride above said metal silicide contacts and said cover layer above said gate electrode.

14. The method of claim 1, wherein planarizing a surface of said process layer to expose said cover layer comprises performing a chemical mechanical polishing operation to planarize a surface of said process layer to expose said cover layer.

15. The method of claim 1, wherein removing said cover layer from above said gate electrode comprises performing a wet etching process to remove said cover layer from above said gate electrode.

16. The method of claim 1, wherein forming a second metal layer comprised of a refractory metal above said gate electrode and said process layer comprises depositing a second metal layer comprised of a refractory metal above said gate electrode and said process layer.

17. The method of claim 1, wherein forming a second metal layer comprised of a refractory metal above said gate electrode and said process layer comprises forming a second metal layer comprised of at least one of cobalt, titanium, tungsten, nickel, zirconium, tantalum, platinum and molybdenum above said gate electrode and said process layer.

18. The method of claim 1, wherein converting at least a portion of said second metal layer to a metal silicide region above said gate electrode comprises performing at least two anneal processes to convert at least a portion of said second metal layer to a metal silicide region above said gate electrode.

19. A method, comprising:
    forming a gate insulation layer comprised of at least one of silicon dioxide, silicon nitride and silicon oxynitride above a surface of a semiconducting substrate;
    forming a gate electrode comprised of polysilicon above said gate insulation layer;
    forming a cover layer above said gate electrode;
    performing at least one ion implantation process to form source/drain regions in said substrate proximate said gate electrode;

depositing a first metal layer comprised of a refractory metal above said cover layer and said source/drain regions;

converting at least a portion of said first metal layer to metal silicide contacts above said source/drain regions;

forming a process layer above said metal silicide contacts and said cover layer above said gate electrode;

planarizing a surface of said process layer to expose said cover layer;

removing said cover layer from above said gate electrode;

depositing a second metal layer comprised of a refractory metal above said gate electrode and said process layer; and converting at least a portion of said second metal layer to a metal silicide above said gate electrode.

20. The method of claim 19, wherein forming a gate insulation layer comprised of at least one of silicon dioxide, silicon nitride and silicon oxynitride above a surface of a semiconducting substrate comprises forming a gate insulation layer comprised of at least one of silicon dioxide, silicon nitride and silicon oxynitride by at least one of a deposition process and a thermal growth process above a surface of a semiconducting substrate.

21. The method of claim 19, wherein forming a gate electrode comprised of polysilicon above said gate insulation layer comprises:

depositing a layer of polysilicon; and patterning said layer of polysilicon to define a gate electrode comprised of polysilicon.

22. The method of claim 19, wherein forming a cover layer above said gate electrode comprises forming a cover layer comprised of at least one of silicon nitride, silicon oxynitride and silicon rich nitride above said gate electrode.

23. The method of claim 19, wherein forming a cover layer above said gate electrode comprises depositing a cover layer above said gate electrode.

24. The method of claim 19, wherein depositing a first metal layer comprised of a refractory metal above said cover layer and said source/drain regions comprises depositing a first metal layer comprised of at least one of cobalt, titanium, tungsten, nickel, zirconium, tantalum, platinum and molybdenum above said cover layer and said source/drain regions.

25. The method of claim 19, wherein converting at least a portion of said first metal layer to metal silicide contacts above said source/drain regions comprises performing at least one anneal process to convert at least a portion of said first metal layer to metal silicide contacts above said source/drain regions.

26. The method of claim 19, wherein forming a process layer above said metal silicide contacts and said cover layer above said gate electrode comprises depositing a process layer above said metal silicide contacts and said cover layer above said gate electrode.

27. The method of claim 19, wherein forming a process layer above said metal silicide contacts and said cover layer above said gate electrode comprises forming a process layer comprised of a material that is selectively etchable with respect to a material comprising said cover layer.

28. The method of claim 19, wherein planarizing a surface of said process layer to expose said cover layer comprises performing a chemical mechanical polishing operation to planarize a surface of said process layer to expose said cover layer.

29. The method of claim 19, wherein removing said cover layer from above said gate electrode comprises performing a wet etching process to remove said cover layer from above said gate electrode.

30. The method of claim 19, wherein depositing a second metal layer comprised of a refractory metal above said gate electrode and said process layer comprises depositing a second metal layer comprised of at least one of cobalt, titanium, tungsten, nickel, zirconium, tantalum, platinum and molybdenum above said gate electrode and said process layer.

31. The method of claim 19, wherein converting at least a portion of said second metal layer to a metal silicide above said gate electrode comprises performing at least two anneal processes to convert at least a portion of said second metal layer to a metal silicide above said gate electrode.

32. A method, comprising:

growing a gate insulation layer comprised of silicon dioxide above a surface of a semiconducting substrate;

forming a gate electrode comprised of polysilicon above said gate insulation layer;

depositing a cover layer comprised of silicon nitride above said gate electrode;

forming source/drain regions in said substrate proximate said gate electrode;

depositing a first metal layer comprised of cobalt above said cover layer and said source/drain regions;

converting at least a portion of said first metal layer to cobalt silicide contacts above said source/drain regions;

depositing a process layer above said cobalt silicide contacts and said cover layer above said gate electrode;

planarizing a surface of said process layer to expose said cover layer;

removing said cover layer from above said gate electrode;

depositing a second metal layer comprised of a refractory metal above said gate electrode and said process layer; and converting at least a portion of said second metal layer to a metal silicide region above said gate electrode.

33. The method of claim 32, wherein forming source/drain regions in said substrate proximate said gate electrode comprises performing at least one ion implantation process to form source/drain regions in said substrate proximate said gate electrode.

34. The method of claim 32, wherein converting at least a portion of said first metal layer to cobalt silicide contacts above said source/drain regions comprises performing at least one anneal process to convert at least a portion of said first metal layer to cobalt silicide contacts above said source/drain regions.

35. The method of claim 32, wherein depositing a process layer above said metal silicide contacts and said cover layer above said gate electrode comprises depositing a process layer comprised of a material that is selectively etchable with respect to a material comprising said cover layer.

36. The method of claim 32, wherein planarizing a surface of said process layer to expose said cover layer comprises performing a chemical mechanical polishing operation to planarize a surface of said process layer to expose said cover layer.

37. The method of claim 32, wherein depositing a second metal layer comprised of a refractory metal above said gate electrode and said process layer comprises depositing a second metal layer comprised of at least one of cobalt, titanium, tungsten, nickel, zirconium, tantalum, platinum and molybdenum above said gate electrode and said process layer.

38. The method of claim 32, wherein converting at least a portion of said second metal layer to a metal silicide region above said gate electrode comprises performing at least two anneal processes to convert at least a portion of said second metal layer to a metal silicide region above said gate electrode.

* * * * *